(12) United States Patent
Chen et al.

(10) Patent No.: US 9,875,720 B2
(45) Date of Patent: Jan. 23, 2018

(54) DISPLAY WALL

(71) Applicant: BOE TECHNOLOGY GROUP CO., LTD., Beijing (CN)

(72) Inventors: Yanshun Chen, Beijing (CN); Youmei Dong, Beijing (CN); Wenbo Li, Beijing (CN); Guanghui Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 67 days.

(21) Appl. No.: 14/354,824

(22) PCT Filed: Dec. 18, 2013

(86) PCT No.: PCT/CN2013/089780
§ 371 (c)(1),
(2) Date: Apr. 28, 2014

(87) PCT Pub. No.: WO2015/024346
PCT Pub. Date: Feb. 26, 2015

(65) Prior Publication Data
US 2015/0206503 A1 Jul. 23, 2015

(30) Foreign Application Priority Data

Aug. 23, 2013 (CN) .......................... 2013 1 0373785

(51) Int. Cl.
G09G 5/00 (2006.01)
G09F 19/22 (2006.01)
(Continued)

(52) U.S. Cl.
CPC ......... *G09G 5/003* (2013.01); *G02F 1/13306* (2013.01); *G06F 3/1446* (2013.01);
(Continued)

(58) Field of Classification Search
CPC ............. G09G 5/003; G09G 2300/026; G09G 2330/02; H04N 13/0402; G02F 1/13306; G02F 15/00; G02F 2001/13324
See application file for complete search history.

(56) References Cited

U.S. PATENT DOCUMENTS 6,093,477 A * 7/2000 Matsufusa .............. G06F 3/044
178/18.03
2007/0089784 A1* 4/2007 Noh et al. ..................... 136/263
(Continued)

FOREIGN PATENT DOCUMENTS

CN 1690324 A 11/2005
CN 101311776 A 11/2008
(Continued)

OTHER PUBLICATIONS

Chinese Office Action dated Jan. 5, 2015 regarding Application No. 201310373785.2, filed Aug. 23, 2013. Translation provided by Dragon Intellectual Property Law Firm.
(Continued)

*Primary Examiner* — Sahlu Okebato
(74) *Attorney, Agent, or Firm* — Harness. Dickey & Pierce, P.L.C.

(57) ABSTRACT

The present invention discloses a display wall comprising a display device and a solar panel for supplying power to the display device, wherein the display device and the solar panel are laminated.

15 Claims, 3 Drawing Sheets

(51) Int. Cl.
*G02F 1/133* (2006.01)
*G09F 15/00* (2006.01)
*H01L 27/32* (2006.01)
*H04N 13/04* (2006.01)
*G06F 3/14* (2006.01)

(52) U.S. Cl.
CPC .............. *G09F 15/00* (2013.01); *G09F 19/22* (2013.01); *H01L 27/3227* (2013.01); *H04N 13/0402* (2013.01); *G02F 2001/13324* (2013.01); *G09G 2300/023* (2013.01); *G09G 2300/026* (2013.01); *G09G 2330/02* (2013.01); *G09G 2330/021* (2013.01); *H04N 2213/001* (2013.01)

(56) References Cited

U.S. PATENT DOCUMENTS

| | | | |
|---|---|---|---|
| 2007/0152928 A1* | 7/2007 | Doane et al. | 345/87 |
| 2008/0000515 A1* | 1/2008 | Lin et al. | 136/246 |
| 2008/0094025 A1* | 4/2008 | Rosenblatt | G06F 1/1616 320/101 |
| 2012/0188637 A1* | 7/2012 | Joseph | G02B 27/2278 359/478 |
| 2013/0050599 A1* | 2/2013 | Yoshida | H01L 31/075 349/33 |
| 2013/0108858 A1* | 5/2013 | Biteau | C03C 1/008 428/304.4 |
| 2013/0147764 A1* | 6/2013 | Chaji et al. | 345/175 |
| 2014/0139651 A1* | 5/2014 | Jiang | G02B 27/2214 348/52 |
| 2014/0149811 A1* | 5/2014 | Ross et al. | 714/724 |

FOREIGN PATENT DOCUMENTS

| | | |
|---|---|---|
| CN | 101487938 A | 7/2009 |
| CN | 101719419 A | 6/2010 |
| CN | 101919054 A | 12/2010 |
| CN | 201984739 U | 9/2011 |
| CN | 102279485 A | 12/2011 |
| CN | 102290003 A | 12/2011 |
| CN | 102621737 A | 8/2012 |
| CN | 202390971 U | 8/2012 |
| CN | 202483036 U | 10/2012 |
| CN | 103033996 A | 4/2013 |
| CN | 103207462 A | 7/2013 |
| CN | 203049951 U | 7/2013 |
| CN | 203118374 U | 8/2013 |
| JP | 2006003698 A | 1/2006 |
| KR | 20110045520 A | 5/2011 |
| TW | 201100877 A | 1/2011 |

OTHER PUBLICATIONS

Office Action of Chinese application No. 201310373785.2, dated Aug. 3, 2015. Translation provided by Dragon Intellectual Property Law Firm.
Written Opinion of the International Searching Authority for international application No. PCT/CN2013/089780.

* cited by examiner

DISPLAY WALL

CROSS-REFERENCE TO RELATED APPLICATION

This application is the U.S. national phase of PCT Application No. PCT/CN2013/089780 filed on Dec. 18, 2013, which claims priority to Chinese Patent Application No. 201310373785.2 filed on Aug. 23, 2013, the disclosures of which are incorporated in their entirety by reference herein.

TECHNICAL FIELD

The present invention relates to a field of display technology, and in particular to a display wall.

BACKGROUND

The curtain wall is a protection for an exterior wall of a building, does not bear the weight, and is suspended like a curtain. Therefore, the curtain wall is also referred to as a suspended wall, and is a light-weight wall which is usually used to impart a decorative effect to large and high-rise buildings. Wherein, a glass display wall is a commonly used one of all kinds of the curtain walls.

The glass display wall is a kind of beautiful and novel decoration for building walls, and represents a distinguishing feature the age of modern high-rise building.

Currently, on some important buildings, the glass display wall and a large display device are used for displaying advertisements for various products and various services, or for releasing news, or for improving a night scene of a building through a dynamic visual effect.

How to save energy consumption during display of the glass display wall is a technical problem that needs to be solved by those skilled in the art.

SUMMARY

The present invention provides a display wall. The display wall can save energy consumption during display, because a solar panel is used for supplying power with the display wall.

In order to achieve the above-mentioned purpose, the present invention provides the following technical schemes:

A display wall comprising a display device and a solar panel for supplying power to the display device, wherein the display device and the solar panel are laminated.

In the above-mentioned display wall, the solar panel converts sunlight in nature into electric energy, and thus supplies power to the display device. In the case that the display device and the solar panel are laminated, a requirement for thickness of the display wall can be met.

The display device in the above-mentioned display wall uses the electric energy converted from the solar energy by the solar panel during display, so that the energy sources can be saved.

Preferably, the solar panel is a transparent solar panel, and the display device is a transparent display device. In the case that the solar panel is the transparent solar panel and the display device is the transparent display device, the solar panel and the display device can be laminated in a variety of ways, and double-side display of the display wall can easily be implemented and transparency of the display wall can be improved easily.

Preferably, the solar panel is a dye-sensitized solar panel.

Preferably, the display wall also includes an accessory for 3D-display and/or an accessory for touch control. The accessory for 3D-display is provided on a side of the solar panel which a light emit from or is integrated inside the solar panel. The accessory for touch control is provided on a light outgoing side of the solar panel or is integrated inside the display device.

When the above-mentioned display wall has the accessory for 3D-display, the display wall has a 3D-display effect, and thereby the display effect of the display wall is improved.

When the above-mentioned display wall has the accessory for touch control, controllability of the display wall is improved.

Preferably, the accessory for 3D-display is a raster-type accessory for 3D-display formed of a counter electrode included in the dye-sensitized solar panel, when the accessory for 3D-display is integrated inside the solar panel. Alternatively, the accessory for 3D-display is a raster-type accessory for 3D-display, which is formed by metal wires between a mesoporous photo-anode in the dye-sensitized solar panel and a conducting layer adjacent to the mesoporous photo-anode, when the accessory for 3D-display is integrated inside the solar panel.

Preferably, the display device is a self-luminous bi-directional transparent display device, and the display device has the accessory for 3D-display or the accessory for touch control on both sides of the display device.

In the above-mentioned display wall, when the display device has the accessory for 3D-display on both sides of the display device, the 3D-display can be implemented on both faces of the display wall, and thereby the display effect of the display wall can be further improved.

In the above-mentioned display wall, the display device can be manipulated on both faces of the display wall when the display device has the accessory for touch control on both sides of the display device, and the controllability can be further improved during the display wall is displaying.

Preferably, the display device is an electroluminescence device or a quantum dot light-emitting device.

Preferably, when the above-mentioned display device is a liquid crystal display device, in order to guarantee that the liquid crystal display device can display both in the day and at night, there exists a light source device between the liquid crystal display device and the solar panel, and the light source device emits light when supplied with power, and the light source device is transparent when not supplied with power.

Alternatively, the light source device is a transparent passive organic light-emitting diode (OLED) device.

Preferably, in order to simplify a structure of the display wall, a transparent substrate of the solar panel which locates in the side of the solar panel and faces the display device is shared as a substrate of the display device which locates in the side of the display device and faces the solar panel.

Preferably, a peripheral circuit of the solar panel and a circuit of the display device are electrically connected through a flexible circuit board or a via hole.

The display wall in embodiments of the present invention can save energy source consumed during displaying and thereby environmental protection and energy saving can be implemented, by combination of the solar panel which can be used for supplying power when the display wall and the display device.

DETAILED DESCRIPTION

The technical scheme in the embodiments of the present invention will be clearly described completely below in combination with the appended drawings in the embodiments of the present invention. Evidently, the described embodiments are only a part of the embodiments of the present invention, and are not all embodiments of the present invention. All the other embodiments, which are acquired by a person having ordinary skill in the art on the basis of the embodiments in the present invention without performing inventive steps, belong to the protection scope of the present invention.

The embodiments of the present invention provide a new type of display wall, which may be a glass display wall, a quartz display wall or a display wall made from other commonly used materials. In the embodiments of the present invention, taking the glass display wall as an example, the technical scheme provided by the present invention is described.

Figure 1:
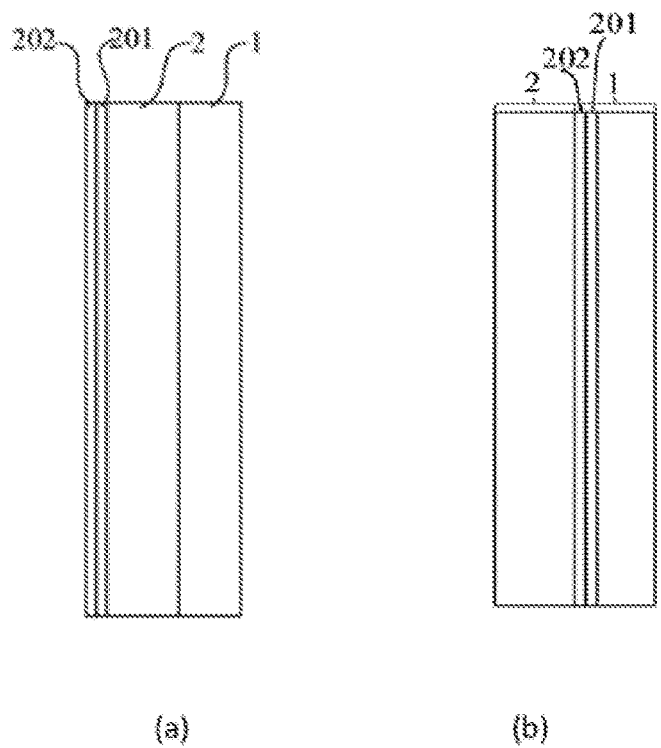
FIG. 1*a* and FIG. 1*b* are structural views showing display walls (*a*) and (*b*) provided by embodiments of the present invention.

With reference to FIG. 1a and FIG. 1b, one embodiment of the present invention provides a glass display wall, which includes a display device 2 and a solar panel 1, and the display device 2 and the solar panel 1 are laminated.

In the above-mentioned glass display wall, the solar panel 1 converts sunlight in nature into electric energy, and thus supplies power to the display device 2. In the case that the display device 2 and the solar panel 1 are laminated, a requirement for thickness of the glass display wall can be met.

In the above-mentioned glass display wall, the solar panel 1 can be charged, provided acquiring sunlight. During display, the display device 2 uses the electric energy converted from the solar energy by the solar panel 1, and thus the energy can be saved.

In the above-mentioned glass display wall, at least one of the solar panel 1 and the display device 2 of may be provided as a transparent structure. In this way, the solar panel 1 may be provided on the side of the glass display wall which faces indoors, or the solar panel 1 may be provided on the side of the glass display wall which faces outdoors.

In a preferable embodiment, the above-mentioned solar panel 1 is a transparent solar panel, and the display device 2 is a transparent solar panel. In the case that the above-mentioned solar panel 1 is the transparent solar panel and the display device 2 is the transparent display device, the solar panel and the display device can be laminated in a variety of ways, and double-side display of the glass display wall can easily be implemented, and transparency of the glass display wall can easily be improved to implement transparent display of the glass display wall.

When the solar panel 1 is the transparent solar panel and the display 2 is the transparent display device, there are a variety of ways for laminating the solar panel 1 and the display device 2, for example:

In the first way, the solar panel 1 is located on a side of the display device 2 which faces outdoors, and a side of the display device 2 which faces the solar panel 1 is a light outgoing side of the display device 2. Because the solar panel 1 is the transparent solar panel, the solar panel 1 doesn't make an influence on the display of the display device 2, and thus outdoor display of the glass display wall can be implemented. The more solar energy can be absorbed by the solar panel 1, the more solar energy can be converted into electric energy.

In the second way, the solar panel 1 is located on the side of the display device 2 which faces outdoors, and a side of the display device 2 which faces indoors is the light outgoing side of the display device 2, and indoor display of the glass display wall can be implemented. Because the solar panel 1 is the transparent solar panel and the display device 2 is the transparent display device, transparency of the glass display wall is higher. Moreover, the more solar energy can be absorbed by the solar panel 1 and the more solar energy can be converted into electric energy.

In the third way, the solar panel 1 is located on the side of the display device 2 which faces indoors, and the side of the display device 2 which faces outdoors is the light outgoing side.

In the fourth way, the solar panel 1 is located on the side of the display device 2 which faces indoors, and the side of the display device 2 which faces indoors is the light outgoing side.

Of course, in the above-mentioned four ways, the display device 2 can be a double-side display device. In this way, indoor display and outdoor display can be implemented simultaneously, regardless that how the transparent solar panel and the transparent display device is laminated.

In a preferable embodiment, the above-mentioned solar panel 1 may be specifically a dye-sensitized solar panel. The cost of the dye-sensitized solar panel is lower, but the photoelectric conversion efficiency of the dye-sensitized solar panel is higher.

Figure 2:
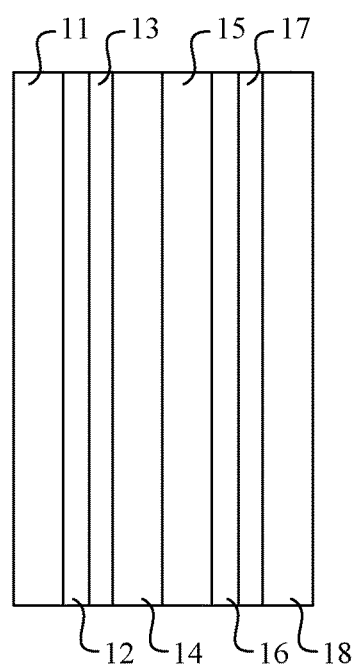
FIG. 2 is a structural view showing a dye-sensitized solar panel in the display wall provided by a embodiment of the present invention.
Figure 3:
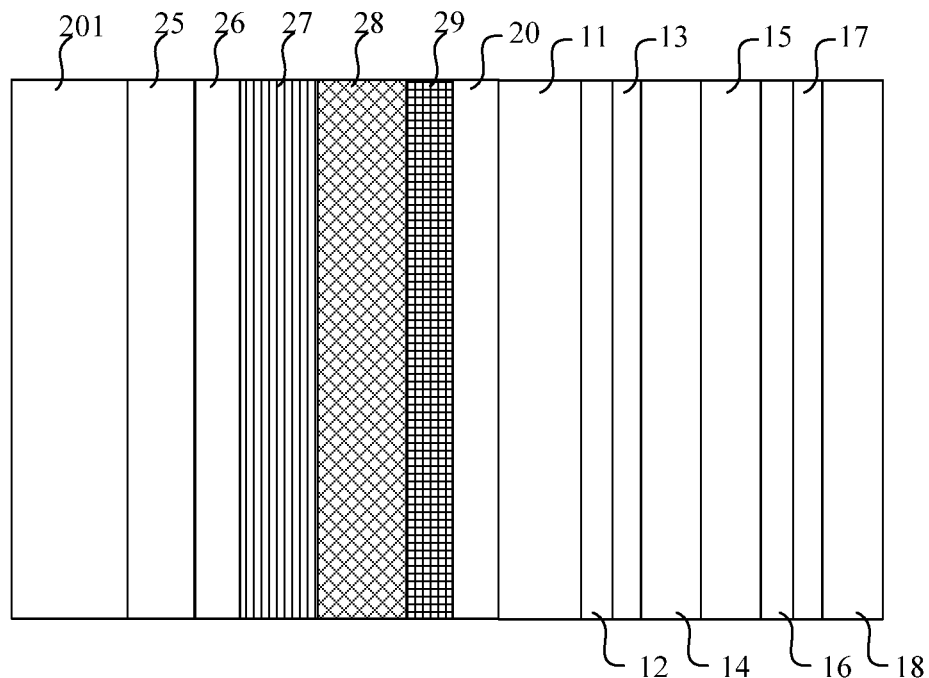
FIG. 3 is a structural view showing the display wall provided by a embodiment of the present invention wherein the display device in the display wall is OLED.
Figure 4:
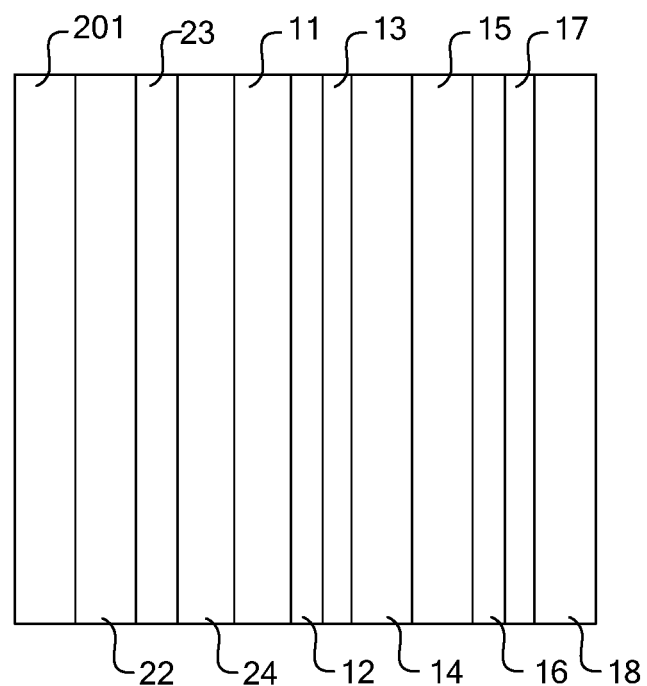
FIG. 4 is a structural view showing the display wall provided by the embodiment of the present invention wherein the display device in the display wall is a liquid crystal display device.

With reference to FIGS. 2, 3 and 4, FIG. 2 is a structural view of the dye-sensitized solar panel in the glass display wall provided by the embodiment of the present invention, FIG. 3 is a structural view of the glass display wall provided by the embodiment of the present invention when the display device in the glass display wall is OLED, and FIG. 4 is a structural view of the glass display wall provided by the embodiment of the present invention when the transparent display device in the glass display wall is a liquid crystal display device.

As shown in FIG. 2, the dye-sensitized solar panel comprises: a first transparent substrate 11, a first conducting layer 12, a counter electrode 13, a electrolyte 14, a dye-sensitizer 15, a mesoporous photo-anode 16, a second conducting layer 17, and a second transparent substrate 18. the first transparent substrate 11 and the second transparent substrate 18 may be a transparent glass substrate or a resin substrate of which transmittance is higher. The first conducting layer 12 and the second conducting layer 17 is a conducting layer made from a transparent material. The above-mentioned transparent material may be Fluorinedoped Tin Oxide (FTO), Indium Tin Oxide (ITO), a carbon nanotube, or graphene. Of course, the above-mentioned first conducting layer 12 and the second may be the transparent conducting layer made from other materials, and the details will not be described here.

The counter electrode 13 is a counter electrode made from Platinum. The counter electrode 13 may be formed on a conducting substrate through a method such as thermal decomposition, sputtering, evaporation, printing, or spraying etc. Electrode materials for forming the counter electrode 13 are required to have good electrical conductivity and superior performance for electrochemical catalysis.

The electrolyte 14 is divided into three kinds of electrolytes according to its physical state: a liquid electrolyte, a quasi-solid electrolyte and a solid electrolyte. $I^-\backslash I^{3-}$ redox couple is the most common one electrolyte, and a solid electrolyte containing redox couple without absorbing light, such as a transparent solid electrolyte Spiro-OMeTAD, has been developed.

The main material for the dye-sensitizer 15 includes a Ruthenium metal complex (N3, N719), an organic dye and the like. The dye-sensitizer 15 is a part of the dye-sensitized solar panel, which can generates electron. The dye-sensitizer 15 has functions to absorb sunlight energy to excite an electron and inject the electron into the mesoporous photo-anode 16, and is subsequently reduced by the electrolyte 14.

The material for preparing the mesoporous photo-anode 16 mainly includes two kinds of N-type semiconductor materials, namely nano titanium dioxide ($TiO_2$) and nano zinc oxide (ZnO). The nano $TiO_2$ particle is most common one of the materials. Photoelectric performance of the dye-sensitized solar panel is better, wherein the mesoporous photo-anode 16 is made of the nano $TiO_2$ particle. In the dye-sensitized solar panel, the mesoporous photo-anode 16 is mainly used as an carrier for absorption of the dye-sensitizer 15 and used as an electron transmission channel, and thus the mesoporous photo-anode 16 should have specific area as large as possible to absorb more dye-sensitizer 15 and to improve the performance of the dye-sensitized solar panel. Simultaneously, aperture of mesoporous of the mesoporous photo-anode 16 should be large enough to facility permeation and diffusion of the electrolyte 14 in the mesoporous photo-anode 16. In order to accept the electron injected by the dye-sensitizer 15, energy level of the materials for preparing the mesoporous photo-anode 16 must be matched with the dye-sensitizer 15.

When area of the dye-sensitized solar panel is larger, metal wires may be added between the conducting layer 17 and the mesoporous photo-anode 16, so as to collect the electron and reduce resistance of the conducting layer 17. The metal materials may be a precious metal wire such as Ag, Au, Pt and the like, and the metal such as Cu, Al and the like may be employed in a non-corrosive electrolyte.

In a preferable embodiment, when the above-mentioned solar panel 1 is the transparent solar panel and the display device 2 is the transparent display device, as shown in FIG. 1a and FIG. 1b. The above-mentioned glass display wall further includes an accessory for 3D-display 201, an accessory for touch control 202 or a combination of the accessory for 3D-display 201 and the accessory for touch control 202. The accessory for 3D-display 201 and the accessory for touch control 202 are provided on the light outgoing side of the display device 2, as shown in FIG. 1a, or the accessory for 3D-display and the accessory for touch control are integrated inside the solar panel 1, as showed in FIG. 1b. The accessory for touch control is provided on the light outgoing side of the display wall, or is integrated inside the display device 2.

When the above-mentioned glass display wall has the accessory for 3D-display provided, the glass display wall has 3D-display effect, and thus display effect of the glass display wall is improved.

When the above-mentioned glass display wall has the accessory for touch control, controllability of the glass display wall is improved.

When the accessory for 3D-display of the above-mentioned glass display wall is integrated inside the solar panel, taking the accessory for 3D-display integrated inside the dye-sensitized solar panel as an example, the accessory for 3D-display may be a raster-type accessory for 3D-display formed of a counter electrode 13 included in the dye-sensitized solar panel, or the accessory for 3D-display may also be formed of the metal wire between a conducting layer 17 and a mesoporous photo-anode 16, when the metal wire is provided between the conducting layer 17 of the dye-sensitized solar panel and the mesoporous photo-anode 16. Formation rules of the metal wire conform to design rules of the accessory for 3D-display, in order to meet a requirement for 3D-display, thereby simplifying a structure of the glass display wall in the case that the similar function is implemented.

Preferably, the above-mentioned display device 2 may be a self-luminous transparent display device, and there exists the accessory for 3D-display or the accessory for touch controls on both sides of the display device 2.

Figure 5:
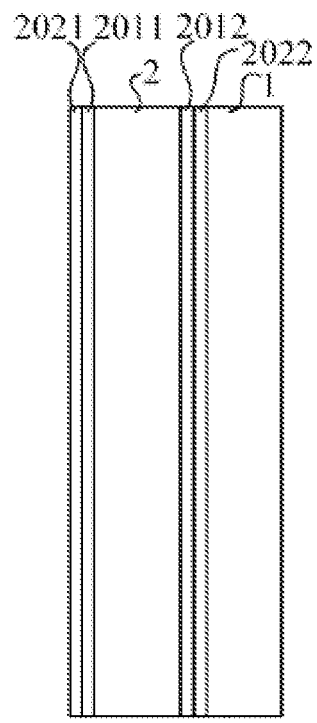
FIG. 5 is a structural view showing the display wall provided by a embodiment of the present invention wherein the display device in the display wall is a bi-directional transparent display device.

In the above-mentioned glass curtain all, when there exist the accessory for 3D-displays on both sides of the display device 2 as shown in FIG. 5, there exists a first accessory for 3D-display 2011 on the side of the transparent display device 2 which depart from the solar panel 1, and there exists a second accessory for 3D-display 2012 on the side of the transparent display device 2 which faces the solar panel 1. In this way, the above-mentioned glass display wall can display 3D-image indoors and outdoors and can perform displaying information in all directions, and thereby display effect of the above-mentioned glass display wall is further improved. Of course, when the first accessory for 3D-display 2011 is provided on one side of the display device 2 and the second accessory for 3D-display 2012 is provided on the other side of the display device 2, for displaying indoors, the image viewed by the indoor viewer is a concave image so that the indoor viewer will feel that felt a indoor space is larger and the image is more natural; for displaying outdoors, the image viewed by the outdoor viewer is a convex image so that the 3D effect viewed by the outdoor viewer is more intuitive and shocking. The concave image or the convex image can be controlled by adjusting an image code, and the details will not be described here.

Except for the structure shown in FIG. 5, the first accessory for 3D-display 2012 may also be provided on the outer side of the solar panel 1.

In the above-mentioned glass display wall, when there exist the accessories for touch control 2021, 2022 on both sides of the display device 2, the display device 2 may be manipulated on both sides of the glass display wall, and controllability of the glass display wall is further improved during display.

In a preferable embodiment, when the display device 2 is the self-luminous bi-directional transparent display device, the display device 2 may be an electroluminescence device or a quantum dot light-emitting device and the like. Of course, the display device 2 may also be other self-luminous bi-directional transparent display devices, and will not be listed here.

Figure 6:
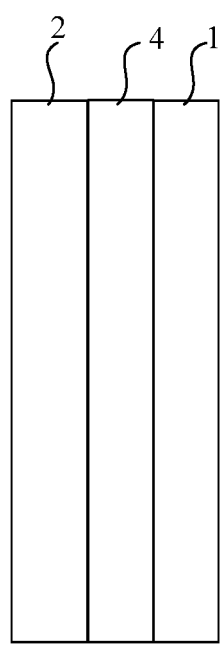
FIG. 6 is a structural view showing the display wall provided by the embodiment of the present invention wherein there exists a light source device between the liquid crystal display device and the solar panel and the display device in the display wall is the liquid crystal display device.

With reference to FIG. 6, when the above-mentioned display device 2 is the liquid crystal display device, such as a liquid crystal panel, in order to guarantee that the liquid crystal display device can display both in the day and at night, there is a light source device 4 between the liquid crystal display device and the solar panel 1. The light source device 4 emits light when supplied with power and is transparent when not supplied with power.

When the above-mentioned liquid crystal display device performs transparent display in the day, the above-mentioned light source device 4 is in a transparent state, and the liquid crystal display device can perform display using natural light. When the above-mentioned liquid crystal display device performs normal display at night, the above-mentioned light source device 4 is provided with electricity, and the above-mentioned light source device 4 emits light to provide a backlight source for the liquid crystal display device, and thus the above-mentioned liquid crystal display device can perform normal display. It should be explained that, the backlight source for the liquid crystal display device of the above-mentioned light source device 4 may also be provided with electricity by the solar panel 1.

Specifically, the above-mentioned light source device 4 may be a transparent passive organic light-emitting diode (OLED) device.

In a preferable embodiment, in order to simplify the structure of the above-mentioned glass display wall, the transparent substrate of the solar panel 1 on the side of the solar panel 1 which faces the display device 2 is shared as a substrate of the display device 2 on the side of the display device 2 which faces the solar panel 1.

Preferably, the above-mentioned display device 2 is the electroluminescence device, the quantum dot light-emitting device or the liquid crystal display device.

As shown in FIG. 3, when the above-mentioned display device 2 is the electroluminescence device, the electroluminescence device includes: a glass substrate 25, a transparent cathode 26, an electron transmission layer 27, an organic light emitting layer 28, a hole transmission layer 29, a transparent anode 20 and another substrate. In this embodiment, the above-mentioned another substrate in the electroluminescence device is shared as the transparent substrate 11 of the dye-sensitized solar panel, namely, the transparent substrate 11 is not only used as the substrate of the dye-sensitized solar panel, but also used as the substrate of the electroluminescence device, so as to simply the structure of the glass display wall. Furthermore, on the light outgoing side of the display device 2, namely the outer side of the glass substrate 25, the accessory for 3D-display 201 may be provided to implement the 3D display effect.

Similarly, when the above-mentioned display device 2 is the liquid crystal display device, the above-mentioned glass display wall may have the following structure comprising: a color film substrate 22, a liquid crystal layer 23, an array substrate 24, the first transparent substrate 11, the first conducting layer 12, the counter electrode 13, the electrolyte 14, the dye-sensitizer 15, the mesoporous anode 16, the second conducting layer 17 and the second transparent substrate 18. Of course, the first transparent substrate 11 and the array substrate 24 share the same substrate, thereby simplifying the structure of the above-mentioned glass display wall. Additionally, on a light outgoing side of the display device 2, namely the outer side of the color film substrate 22, the accessory for 3D-display 201 can also be provided to implement the 3D display effect.

In a preferable embodiment, a peripheral circuit which is used for power supply is provided at the periphery of the solar panel 1. Regarding to the above-mentioned solar panel 1 and the display device 2, the solar panel 1 may supply power to the display device 2 in the following ways:

the peripheral circuit of the solar panel 1 and a circuit of the display device 2 are electrically connected through a flexible circuit board; or the peripheral circuit of the solar panel 1 and the circuit of the display device 2 are electrically connected through a via hole. The via hole may penetrate through two transparent substrates which are attached together each other between the solar panel 1 and the display device 2, or penetrate through the transparent substrate shared by the solar panel 1 and the display device 2.

Of course, the embodiments of the present invention may be altered and modified by those skilled in the art in any way, without departing from the spirit and the scope of the present invention. In this way, the present invention intends to contain the alternations and modifications, in case that these alternations and modifications fall into the scope of the claims and the equivalent technique thereof.

What is claimed is:

1. A display wall, comprising a display device and a solar panel for supplying power to the display device, wherein the display device and the solar panel are laminated, the solar panel is a transparent solar panel and the display device is a transparent display device;

wherein the display wall further comprises an accessory for 3D-display configured to have a 3D effect, the accessory for 3D-display being integrated inside the solar panel; and wherein the accessory for 3D-display is a raster-type accessory for 3D-display formed by a counter electrode included in the solar panel.

2. The display wall according to claim 1, wherein the solar panel and the display device are laminated in one of the following ways:

the solar panel is located on a side of the display device that faces outdoors, and a side of the display device that faces the solar panel is a light outgoing side of the display device to implement an outdoor display can be implemented by the display wall;

the solar panel is located on the side of the display device that faces outdoors, and a side of the display device that faces indoors is the light outgoing side of the display device to implement an indoor display can be implemented by the display wall;

the solar panel is located on the side of the display device that faces indoors, and the side of the display device that faces outdoors is the light outgoing side of the display device to implement the outdoor display can be implemented by the display wall; and the solar panel is located on the side of the display device that faces indoors, and the side of the display device that faces indoors is the light outgoing side of the display device to implement the indoor display that can be implemented by the display wall.

3. The display wall according to claim 1, wherein the solar panel is a dye-sensitized solar panel.

4. The display wall according to claim 1, further comprising an accessory for touch control, wherein the accessory for touch control is provided on a light outgoing side of the display wall or the accessory for touch control is integrated inside the display device.

5. The display wall according to claim 4, wherein the display device is a self-luminous bi-directional transparent display device, and the display device has the accessory for 3D-display or the accessory for touch control on both sides of the display device.

6. The display wall according to claim 5, wherein the display device is an electroluminescence device.

7. The display wall according to claim 1, wherein the display device is a liquid crystal display device, the display wall further comprises a light source device between the liquid crystal display device and the solar panel, and the light source device emits light when supplied with power and the light source device is transparent when not supplied with power.

8. The display wall according to claim 7, wherein the light source device is a transparent passive organic light-emitting diode device.

9. The display wall according to claim 1, wherein a transparent substrate of the solar panel that is located on a side of the display device and faces the solar panel.

10. The display wall according to claim 1, wherein a peripheral circuit which is used for power supply is provided on a periphery of the solar panel.

11. The display wall according to claim 10, wherein the peripheral circuit of the solar panel and a circuit of the display device are electrically connected through a flexible circuit board, so that the solar panel supplies power to the display device.

12. The display wall according to claim 10, wherein the peripheral circuit of the solar panel and a circuit of the display device are electrically connected through a via hole.

13. The display wall according to claim 12, wherein (i) the via hole penetrates through two adjacent substrates between the solar panel and the display device, or (ii) the via hole penetrates through a substrate shared by the solar panel and the display device.

14. The display wall according to claim 5, wherein the display device is a quantum dot light-emitting device.

15. A display wall, comprising a display device and a solar panel for supplying power to the display device, wherein the display device and the solar panel are laminated, the solar panel is a transparent solar panel and the display device is a transparent display device;

wherein the display wall further comprises an accessory for 3D-display configured to have a 3D effect, the accessory for 3D-display being integrated inside the solar panel; and wherein the accessory for 3D-display is a raster-type accessory for 3D-display that is formed by metal wires between a mesoporous photo-anode of the solar panel and a conducting layer adjacent to the mesoporous photo-anode.

* * * * *